US011665860B2

(12) United States Patent
Lewis et al.

(10) Patent No.: US 11,665,860 B2
(45) Date of Patent: May 30, 2023

(54) FAN CARRIER SYSTEM FOR AN INFORMATION HANDLING SYSTEM

(71) Applicant: Dell Products L.P., Round Rock, TX (US)

(72) Inventors: Jeffrey Michael Lewis, Maynard, MA (US); Stephen Edward Strickland, Foxborough, MA (US)

(73) Assignee: Dell Products L.P., Round Rock, TX (US)

(*) Notice: Subject to any disclaimer, the term of this patent is extended or adjusted under 35 U.S.C. 154(b) by 58 days.

(21) Appl. No.: 17/451,523

(22) Filed: Oct. 20, 2021

(65) Prior Publication Data
US 2023/0124080 A1    Apr. 20, 2023

(51) Int. Cl.
*H05K 7/20* (2006.01)
*G06F 1/20* (2006.01)

(52) U.S. Cl.
CPC ......... *H05K 7/20736* (2013.01); *G06F 1/20* (2013.01)

(58) Field of Classification Search
CPC . G06F 1/20; G06F 1/187; G06F 1/183; G06F 2200/201; G06F 1/181; G06F 1/1679; H05K 7/20172; H05K 5/0208; H05K 5/0221; H05K 5/023; H05K 7/1402; H05K 7/1415; H05K 7/1427; H05K 7/20736
See application file for complete search history.

(56) References Cited

U.S. PATENT DOCUMENTS

| | | | | |
|---|---|---|---|---|
| 10,936,527 | B1* | 3/2021 | Chen | G06F 1/185 |
| 11,570,929 | B2* | 1/2023 | Inda | F04D 29/646 |
| 11,572,896 | B2* | 2/2023 | Lu | F04D 29/601 |
| 2005/0186816 | A1* | 8/2005 | Franz | H01R 13/62933 439/157 |
| 2007/0064385 | A1* | 3/2007 | Paul | G06F 1/187 361/679.48 |
| 2008/0305670 | A1* | 12/2008 | Gattuso | H01L 23/4093 439/342 |
| 2012/0026678 | A1* | 2/2012 | Rodriguez | G06F 1/20 361/679.48 |
| 2014/0003010 | A1* | 1/2014 | Lee | H05K 7/1485 361/759 |
| 2014/0211419 | A1* | 7/2014 | Liao | H05K 7/20181 361/695 |
| 2016/0073554 | A1* | 3/2016 | Marcade | G06F 1/183 211/26 |
| 2017/0042060 | A1* | 2/2017 | Chen | F04D 25/0613 |

(Continued)

*Primary Examiner* — Michael A Matey
(74) *Attorney, Agent, or Firm* — McDermott Will & Emery LLP

(57) ABSTRACT

A fan carrier system, including a fan carrier, including: a fan apparatus having i) a first end positioned opposite to a second end, and ii) a first side positioned opposite to a second side, the first and the second side extending between the first end and the second end; a first piston coupled to the fan apparatus, the first piston positioned along the first side, the first piston translatable between the first end and the second end; a connection assembly coupled to a first end of the first piston, the connection assembly including a first connector; a handle assembly, including: a first arm coupled to the first piston via a first handle pin, the first arm further including a first carrier pin; a handle coupled to the first arm; a chassis, including: a first wall and a second wall each including a respective slot.

20 Claims, 10 Drawing Sheets

(56) References Cited

U.S. PATENT DOCUMENTS

| | | | |
|---|---|---|---|
| 2020/0260615 A1* | 8/2020 | Leigh | G06F 1/20 |
| 2020/0318654 A1* | 10/2020 | Hsieh | F04D 29/083 |
| 2021/0131450 A1* | 5/2021 | Yang | F04D 19/002 |
| 2022/0210944 A1* | 6/2022 | Di Idihuweii | F04D 25/14 |
| 2022/0225535 A1* | 7/2022 | Yow | H05K 7/20727 |

* cited by examiner

FAN CARRIER SYSTEM FOR AN INFORMATION HANDLING SYSTEM

BACKGROUND

Field of the Disclosure

The disclosure relates generally to an information handling system, and in particular, a fan carrier system for the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Fan structures in information handling systems, and in particular cable routing of the fan structures, can add air blockages and/or acoustic impacts to the information handling system. Additionally, the fan structures can add unnecessary vibration to the information handling system.

SUMMARY

Innovative aspects of the subject matter described in this specification may be embodied in a method of a fan carrier system, comprising: a fan carrier, including: a fan apparatus having i) a first end positioned opposite to a second end, and ii) a first side positioned opposite to a second side, the first and the second side extending between the first end and the second end; a first piston coupled to the fan apparatus, the first piston positioned along the first side, the first piston translatable between the first end and the second end; a connection assembly coupled to a first end of the first piston, the connection assembly including a first connector; a handle assembly, including: a first arm coupled to the first piston via a first handle pin, the first arm further including a first carrier pin; a handle coupled to the first arm; a chassis, including: a first wall including a first slot, the first slot including a first end positioned opposite a second end; a second wall including a second slot, the second slot including a first end positioned opposite a second end; wherein the fan carrier is insertable into the chassis between the first and the second walls such that when the handle assembly is in a first position, the first carrier pin is positioned at the first end of the first slot, and the first connector of the connection assembly is disengaged from a second connector of a printed circuit board (PCB), and when the handle assembly is in a second position, the first carrier pin is positioned at the second end of the first slot, and the first connector of the connection assembly is engaged with the second connector of the PCB, wherein the handle assembly is rotatable about the first handle pin to transfer the handle assembly between the first and the second positions.

Other embodiments of these aspects include corresponding systems and apparatus.

These and other embodiments may each optionally include one or more of the following features. For instance, the fan carrier further including a second piston coupled to the fan apparatus, the second positioned along the second side, the second piston translatable between the first end and the second end; and the handle assembly further includes a second arm coupled to the second piston via a second handle pin, the second arm further including a second carrier pin, the handle additionally coupled to the second arm, wherein when the handle assembly is in the first position, the second carrier pin is positioned at the first end of the second slot, and wherein when the handle assembly is in the second position, the second carrier pin is positioned at the second end of the second slot. The handle assembly is rotatable about the first and the second handle pins to transfer the handle assembly between the first and the second positions. The handle is coupled between the first arm and the second arm. The fan carrier further includes a first sleeve, the first piston at least partially positioned within the sleeve. The fan carrier further includes an extension spring positioned between a second end of the first piston and the second end of the of the fan apparatus, the second end of the first piston opposite to the second end of the first piston. The first wall further includes a first chassis pin and the first arm further includes a first hooking member, wherein when the handle assembly is in the second position, the first hooking member is engaged with the first chassis pin. The handle further includes a locking member, wherein when the handle assembly is in the second position, the locking member is engaged with the connection assembly. The handle further includes one or more dampening gromets, wherein when the handle assembly is in the second position, the dampening gromets are positioned between the handle and the connection assembly. The fan apparatus includes an inlet fan and an exhaust fan. A distance between the first carrier pin and the first handle pin is constant between the first position and the second position of the handle assembly.

Particular implementations of the subject matter described in this specification can be implemented so as to realize one or more of the following advantages. For example, air blockage by the fan is minimized; channel blockage by the connector of the fan is minimized; and vibration between the fan and a PCB is decreased.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
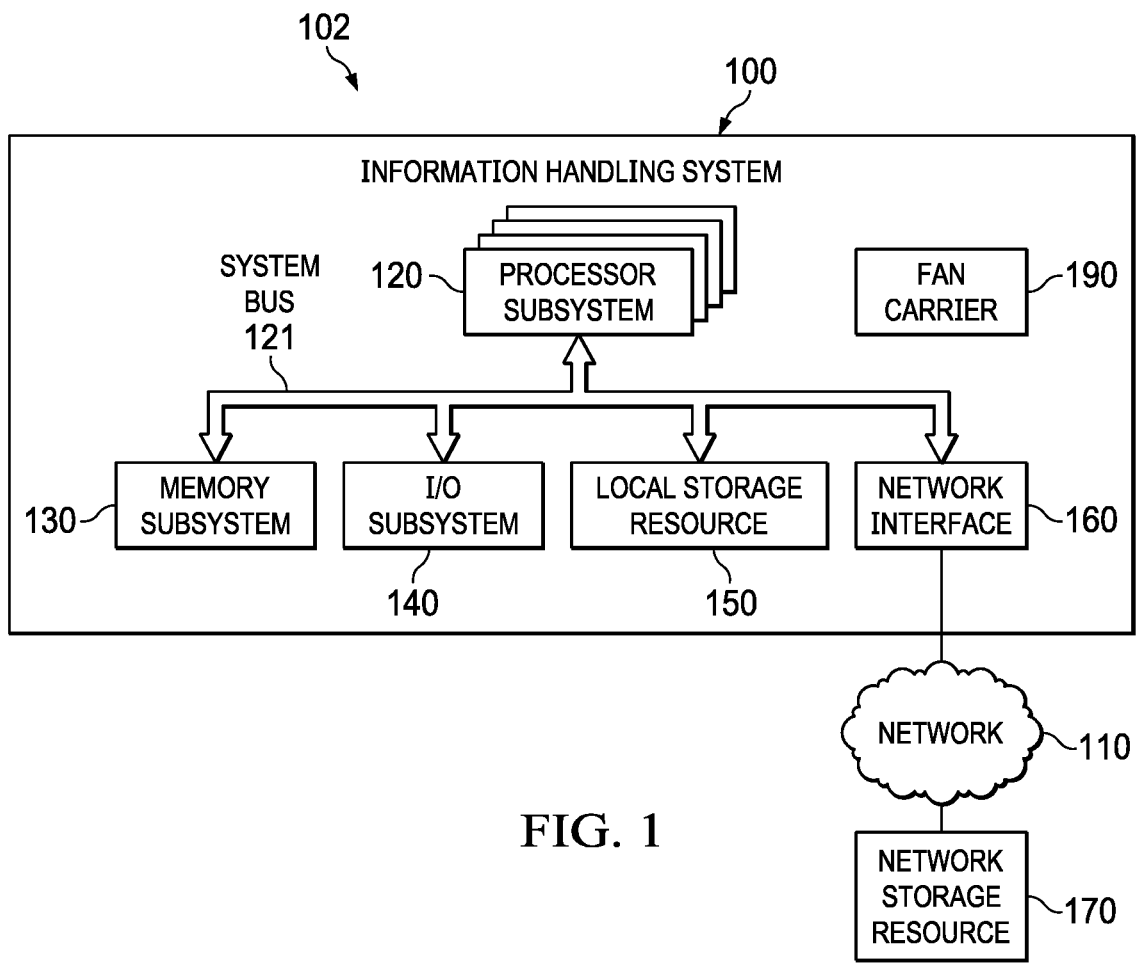
FIG. 1 is a block diagram of selected elements of an embodiment of an information handling system.

This disclosure discusses methods and systems for a fan carrier system of an information handling system. In short, a fan carrier can include a handle assembly that can be mated with a chassis and rotate between first and second positions. The second position of the handle assembly can securely lock a connection between the fan carrier and a printed circuit board (PCB).

Specifically, this disclosure discusses a fan carrier system, including: a fan carrier, including: a fan apparatus having i) a first end positioned opposite to a second end, and ii) a first side positioned opposite to a second side, the first and the second side extending between the first end and the second end; a first piston coupled to the fan apparatus, the first piston positioned along the first side, the first piston translatable between the first end and the second end; a connection assembly coupled to a first end of the first piston, the connection assembly including a first connector; a handle assembly, including: a first arm coupled to the first piston via a first handle pin, the first arm further including a first carrier pin; a handle coupled to the first arm; a chassis, including: a first wall including a first slot, the first slot including a first end positioned opposite a second end; a second wall including a second slot, the second slot including a first end positioned opposite a second end; wherein the fan carrier is insertable into the chassis between the first and the second walls such that when the handle assembly is in a first position, the first carrier pin is positioned at the first end of the first slot, and the first connector of the connection assembly is disengaged from a second connector of a printed circuit board (PCB), and when the handle assembly is in a second position, the first carrier pin is positioned at the second end of the first slot, and the first connector of the connection assembly is engaged with the second connector of the PCB, wherein the handle assembly is rotatable about the first handle pin to transfer the handle assembly between the first and the second positions.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-7 wherein like numbers are used to indicate like and corresponding parts.

Turning now to the drawings, FIG. 1 illustrates a block diagram depicting selected elements of a computing environment 102 including an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can also include a fan carrier 190. The fan carrier 190 can provide air cooling to the information handling system 100, described further herein.

In short, the fan carrier 190 can include a handle assembly that can be mated with a chassis that rotates between first and second positions. The second position of the handle assembly can securely lock a connection between the fan carrier and a printed circuit board (PCB).

Figure 2:
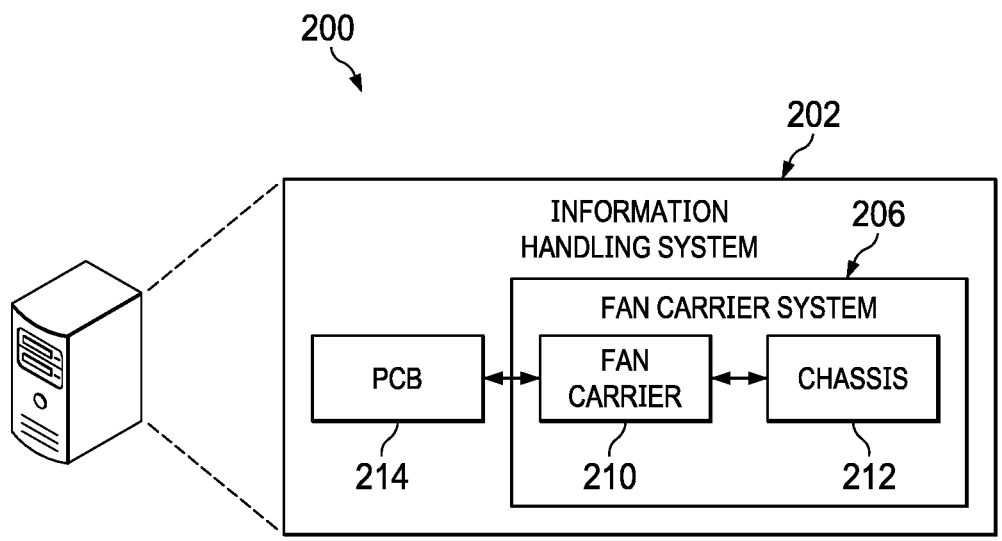
FIG. 2 illustrates a block diagram of an information handling system for including a fan carrier system.

Turning to FIG. 2, FIG. 2 illustrates an environment 200 including an information handling system 202. The information handling system 202 can include a fan carrier system 206 and a printed circuit board (PCB) 214. The fan carrier system 206 can include a fan carrier 210 and a chassis 212. In some examples, the information handling system 202 is similar to, or includes, the information handling system 100 of FIG. 1. In some examples, the fan carrier 210 is the same, or substantially the same, as the fan carrier 190 of FIG. 1.

Figure 3A:
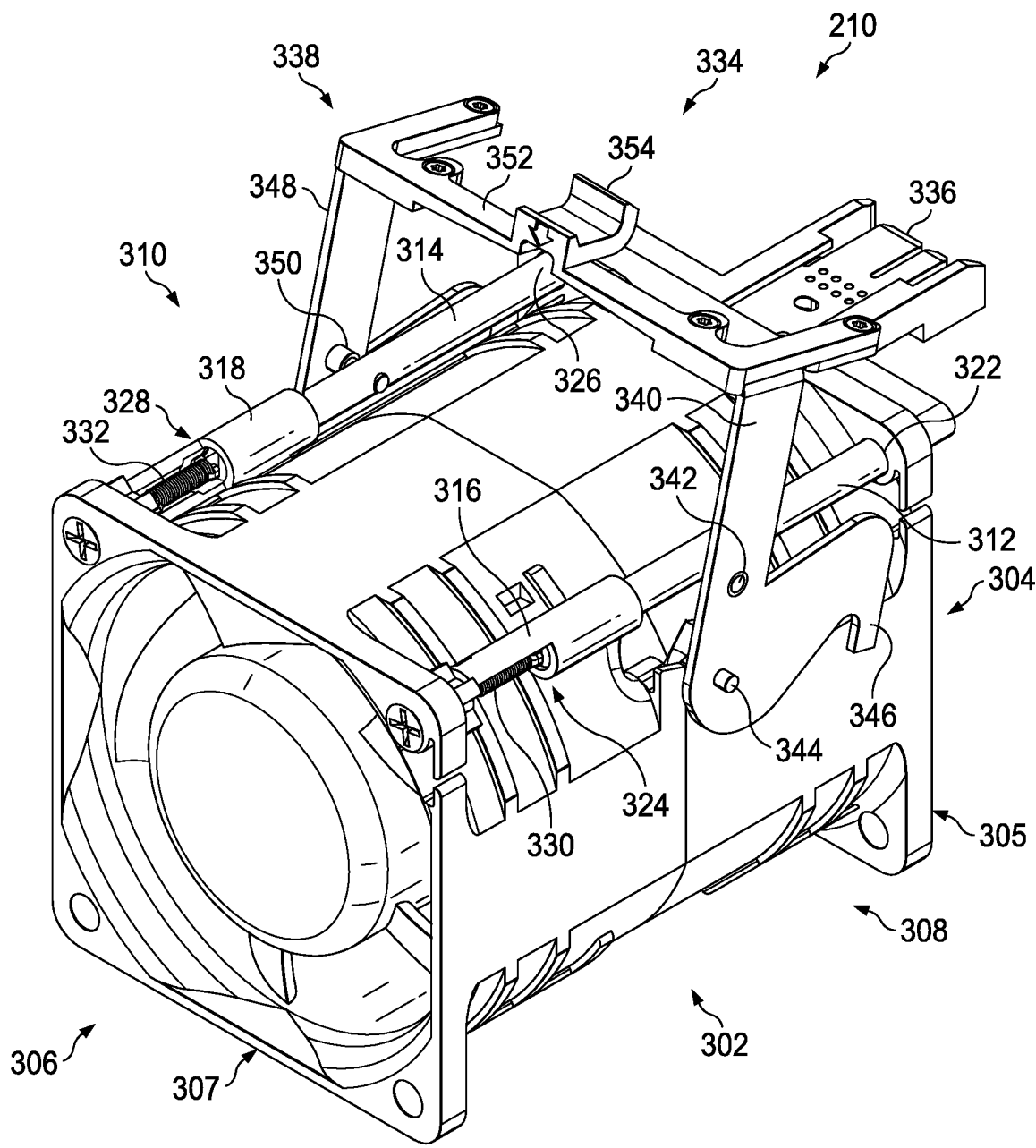
FIG. 3A illustrates a block diagram of an information handling system for including a fan carrier system, in a first implementation.

FIG. 3A illustrates a first implementation of the fan carrier 210. The fan carrier 210 can include a fan apparatus 302. The fan apparatus 302 can include a first end 304 positioned opposite to a second end 306. The fan apparatus 302 can further include a first side 308 positioned opposite to a second side 310. The first side 308 and the second side 310 extend between the first end 304 and the second end 306.

In some examples, the fan carrier 210 can include a first fan 305 and a second fan 307. In some examples, the first fan 305 is an inlet fan and the second fan 307 is an exhaust fan. In some examples, the first fan 305 is an exhaust fan and the second fan 307 is an inlet fan. In some examples, the first fan 305 or the second fan 307 is a baffle. In some examples, the first fan 305 is an exhaust fan and the second fan 307 is a baffle. In some examples, the second fan 307 is an exhaust fan and the first fan 305 is a baffle.

The fan carrier 210 can further include a first piston 312 coupled to the fan apparatus 302. The first piston 312 is positioned along the first side 308 of the fan apparatus 302. The first piston 312 is translatable between the first end 304 and the second end 306 of the fan apparatus 302. The first piston 312 can include a first end 322 positioned opposite to a second end 324. The second piston 314 can include a first end 326 positioned opposite to a second end 328.

The fan carrier 210 can further include a second piston 314 coupled to the fan apparatus 302. The second piston 314 is positioned along the second side 310 of the fan apparatus 302. The second piston 314 is translatable between the first end 304 and the second end 306 of the fan apparatus 302.

In some examples, the fan carrier 210 can further include a first sleeve 316. The first piston 312 can be at least partially positioned within the first sleeve 316. The fan carrier 210 can further include a second sleeve 318. The second piston 314 can be at least partially positioned within the second sleeve 318. In some examples, the first sleeve 316 and the second sleeve 318 are stationary (i.e., relative to the motion of the first piston 312 and the second piston, respectfully).

Figure 3B:
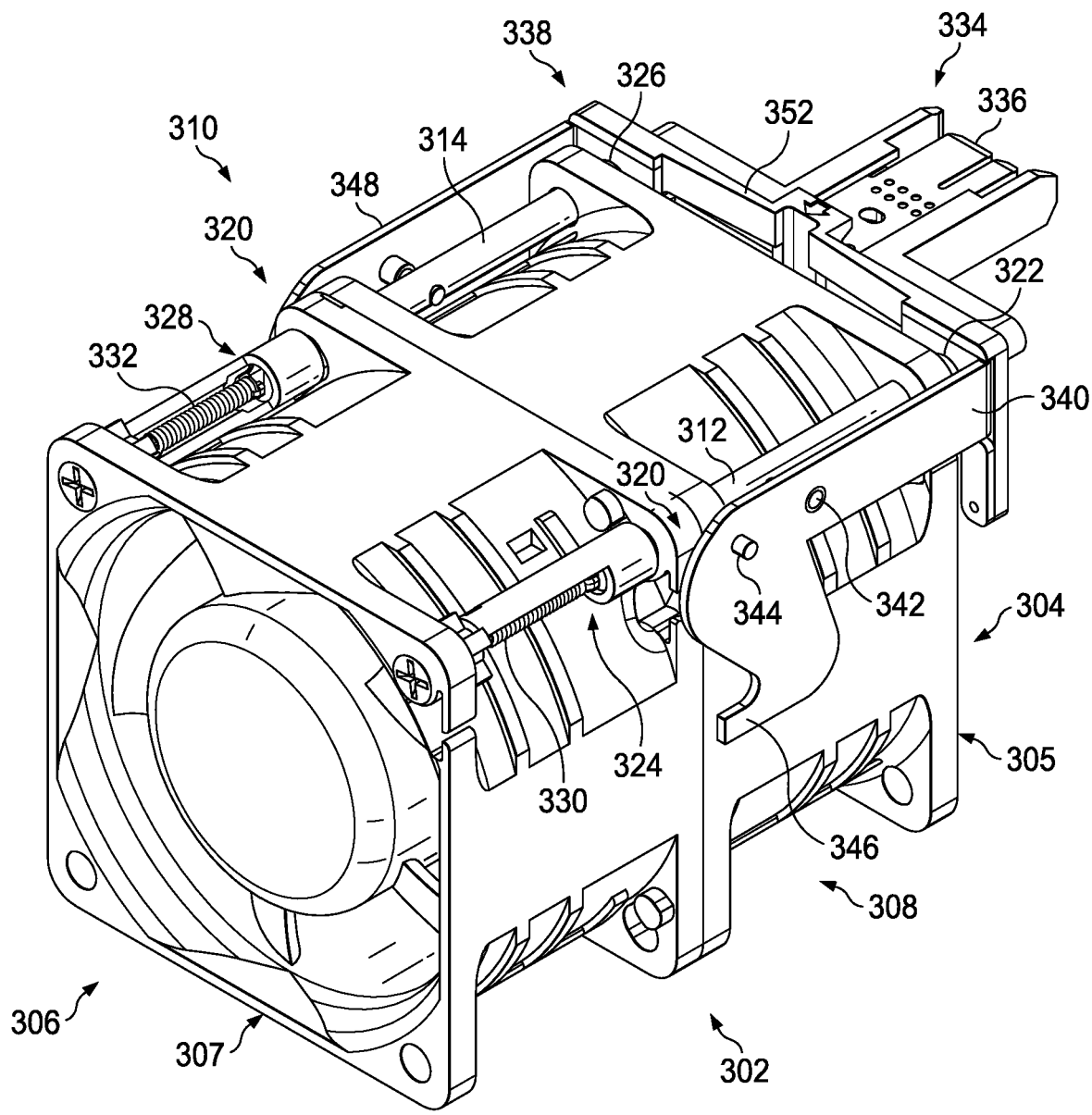
FIG. 3B illustrates a block diagram of an information handling system for including a fan carrier system, in a second implementation.

In some examples, the fan carrier 210 can include alignment features 320, as shown in FIG. 3B. When the fan carrier 210 includes the alignment features 320, the first piston 314 and the second piston 316 can be at least partially positioned though the alignment features 320. When the fan carrier 210 includes the alignment features 320, the fan carrier 210 can be absent of the first sleeve 316 and the second sleeve 318.

Referring back to FIG. 3A, the fan carrier 210 can include a first extension spring 330 positioned between the second end 324 of the first piston 312 and the second end 306 of the fan apparatus 302. The fan carrier 210 can include a second extension spring 332 positioned between the second end 328 of the second piston 314 and the second end 306 of the fan apparatus 302. When the fan carrier 210 is absent of the first sleeve 316 and the second sleeve 318 (when the fan carrier 210 includes the alignment features 320), the fan carrier 210 can further include spring holders (not shown) that couple, respectively, the first extension spring 330 and the second extension spring 332 to the second end 306 of the fan apparatus 302.

The fan carrier 210 can further include a connection assembly 334 coupled to the first piston 312 and the second piston 314. Specifically, the connection assembly 334 can be coupled to the first end 322 of the first piston 312 and the first end 326 of the second piston 314. The connection assembly 334 can include a first connector 336.

The fan carrier 210 can further include a handle assembly 338. The handle assembly 338 can include a first arm 340 coupled to the first piston 312 via a first handle pin 342. The first arm 340 can include a first carrier pin 344. The first arm 340 can include a first hooking member 346. The handle assembly 338 can include a second arm 348 coupled to the second piston 314 via a second handle pin 350. The second arm 348 can include a second carrier pin (not shown), similar to the first carrier pin 344. The second arm 348 can include a second hooking member (not shown), similar to the first hooking member 346.

The handle assembly 338 can include a handle 352. The handle 352 can be coupled to the first arm 340 and the second arm 348, and specifically, the handle 352 is coupled between the first arm 340 and the second arm 348. The handle 352 can further include a locking member 354. The locking member 354 can "lock" the connection assembly 334 and the first connector 336 when the connection assembly 334 is in a second position, described further herein.

The handle assembly 338 can further include dampening gromets (not shown). The dampening gromets can be positioned between the handle 352 and the connection assembly 334 when the handle assembly 338 is in the second position, described further below.

Figure 4A:
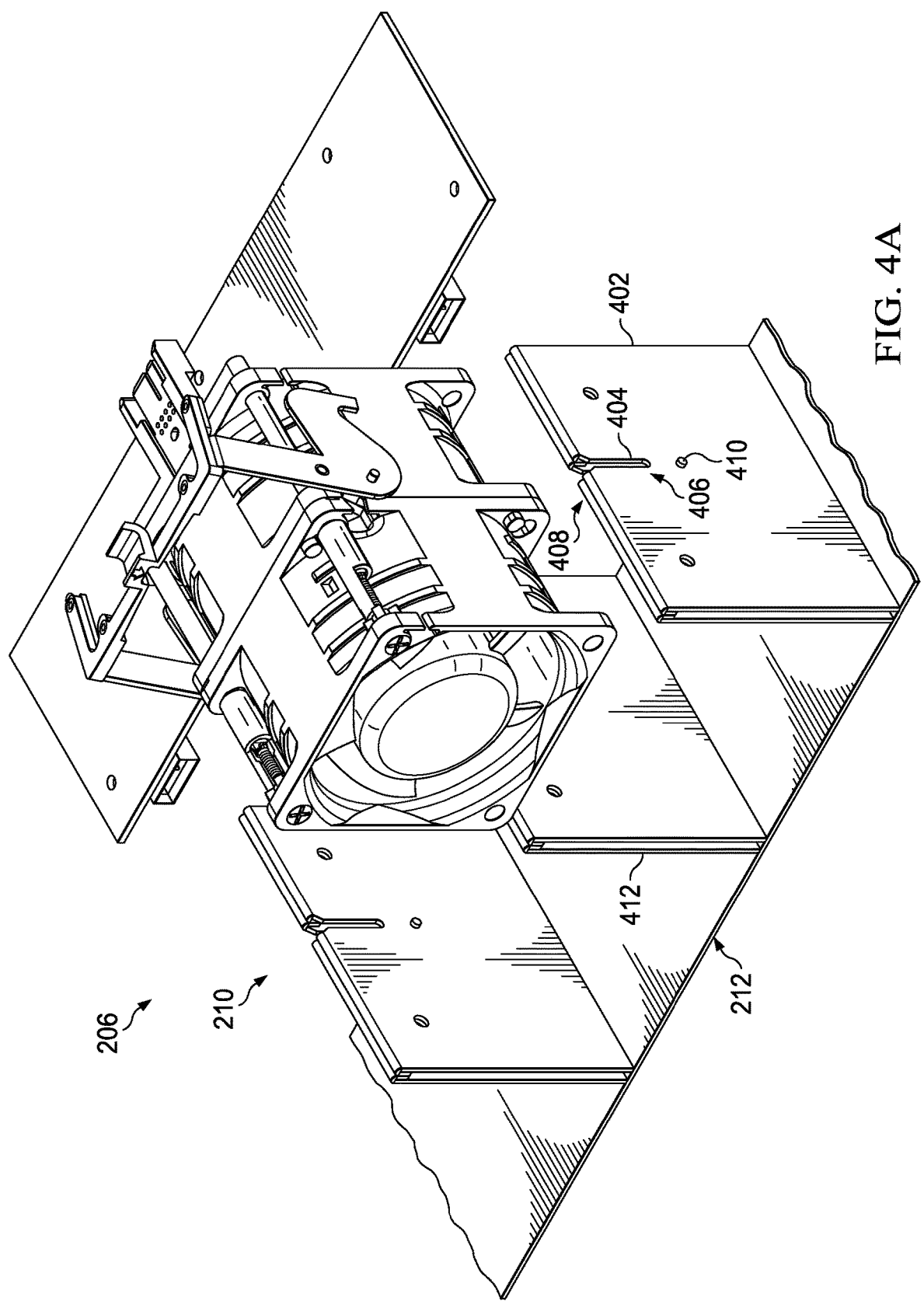
FIGS. 4A, 4B illustrate the fan carrier system, prior to insertion of a fan carrier of the fan carrier system inserted into a chassis.
Figure 4B:
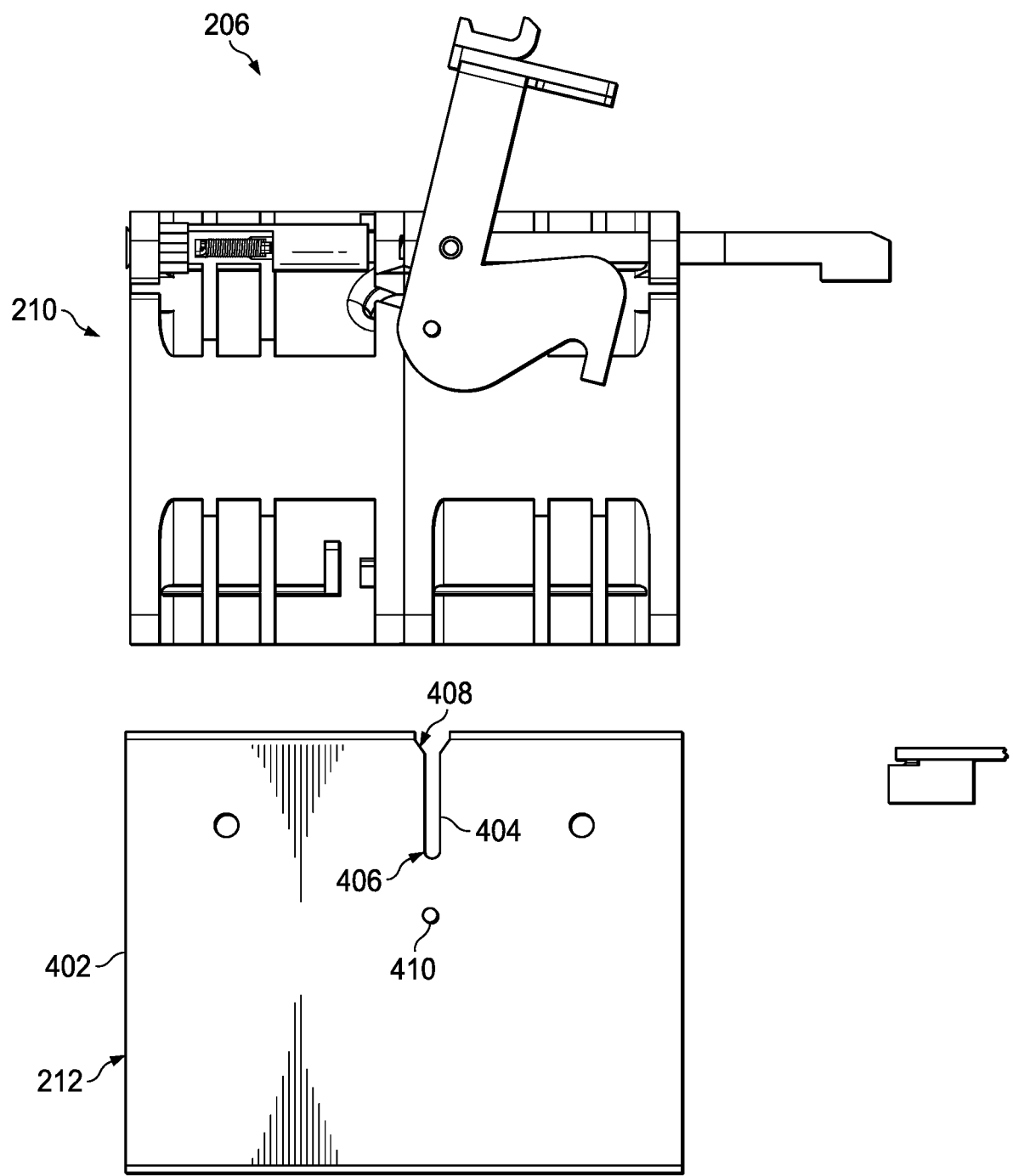

FIGS. 4A, 4B illustrate the fan carrier system 206, and in particular, the fan carrier 210 proximate to the chassis 212. The chassis 212 can include a first wall 402. The first wall 402 can include a first slot 404. The first slot 404 can include a first end 406 positioned opposite to a second end 408. The first wall 402 can include a first chassis pin 410.

The chassis 212 can further include a second wall 412. The second wall 412 can include a second slot (not shown), similar to the first slot 404 of the first wall 402. The second slot can include a first end (not shown) positioned opposite to a second end (not shown), similar to the first end 406 and the second end 408 of the first wall 402. The second wall 412 can include a second chassis pin (not shown), similar to the first chassis pin 410 of the first wall 402.

Figure 5A:
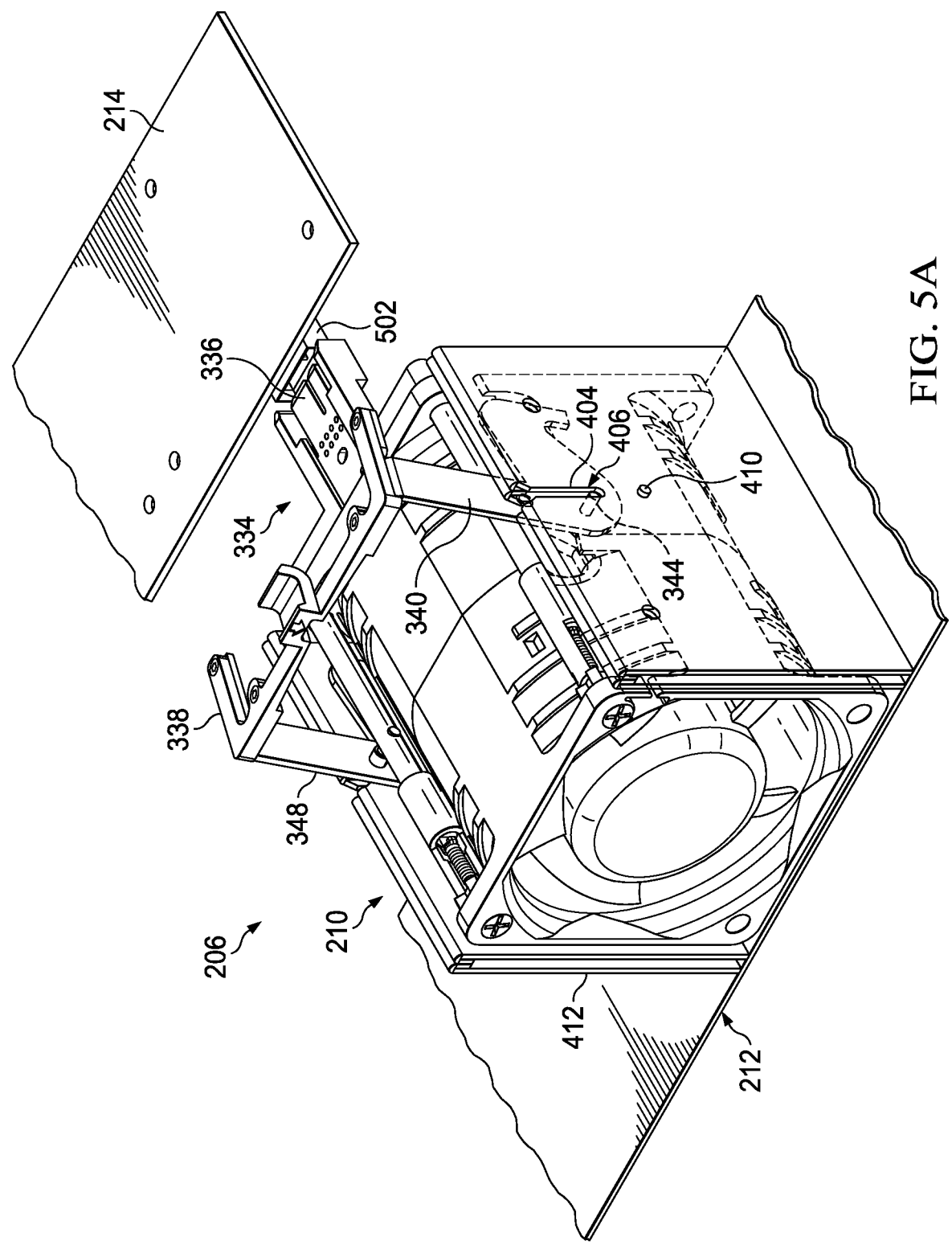
FIGS. 5A, 5B illustrate the fan carrier system, with the fan carrier inserted into the chassis.
Figure 5B:
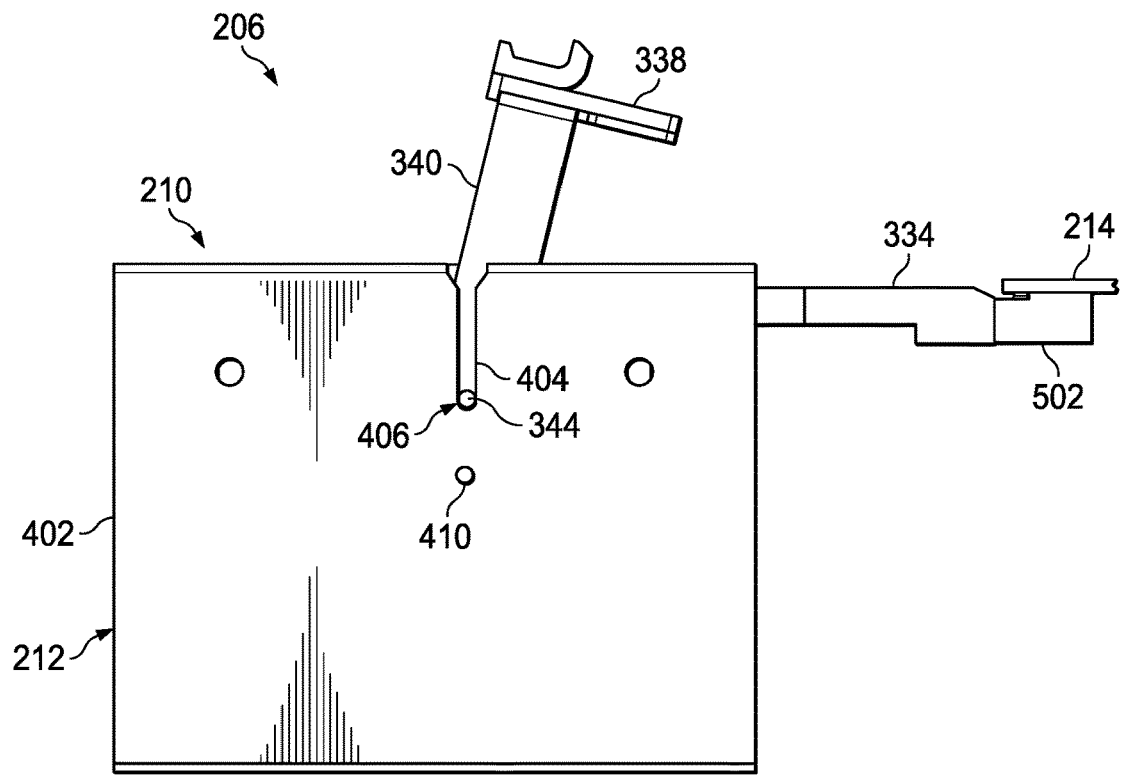

FIGS. 5A, 5B illustrate the fan carrier system 206, in particular, the fan carrier 210 inserted into the chassis 212. Specifically, the fan carrier 210 is insertable into the chassis 212 between the first wall 402 and the second wall 412. When the fan carrier 210 is inserted into the chassis 212, the handle assembly 338 can be in a first position. When the handle assembly 338 is in the first position, the first carrier pin 344 of the first arm 340 of the handle assembly 338 is positioned at the first end 406 of the first slot 404 of the first wall 402 of the chassis 212. Similarly, when the handle assembly 338 is in the first position, the second carrier pin (not shown) of the second arm 348 of the handle assembly 338 is positioned at the first end (not shown) of the second slot (not shown) of the second wall 412 of the chassis 212. Furthermore, when the handle assembly 338 is in the first position, the first connector 336 of the connection assembly 334 is disengaged from a second connector 502 of the PCB 214. Specifically, the first extension spring 330 and the second extension spring 332 can retract (or retain tension on) the connection assembly 334 while the fan carrier 210 is inserted into the chassis 212. The first extension spring 330 and the second extension spring 332 can maintain retraction of the connection assembly 334 while the fan carrier 210 is inserted into the chassis 212 to facilitate (maintain) disengagement of the first connector 336 of the connection assembly 334 from the second connector 502 of the PCB 214.

Figure 6B:
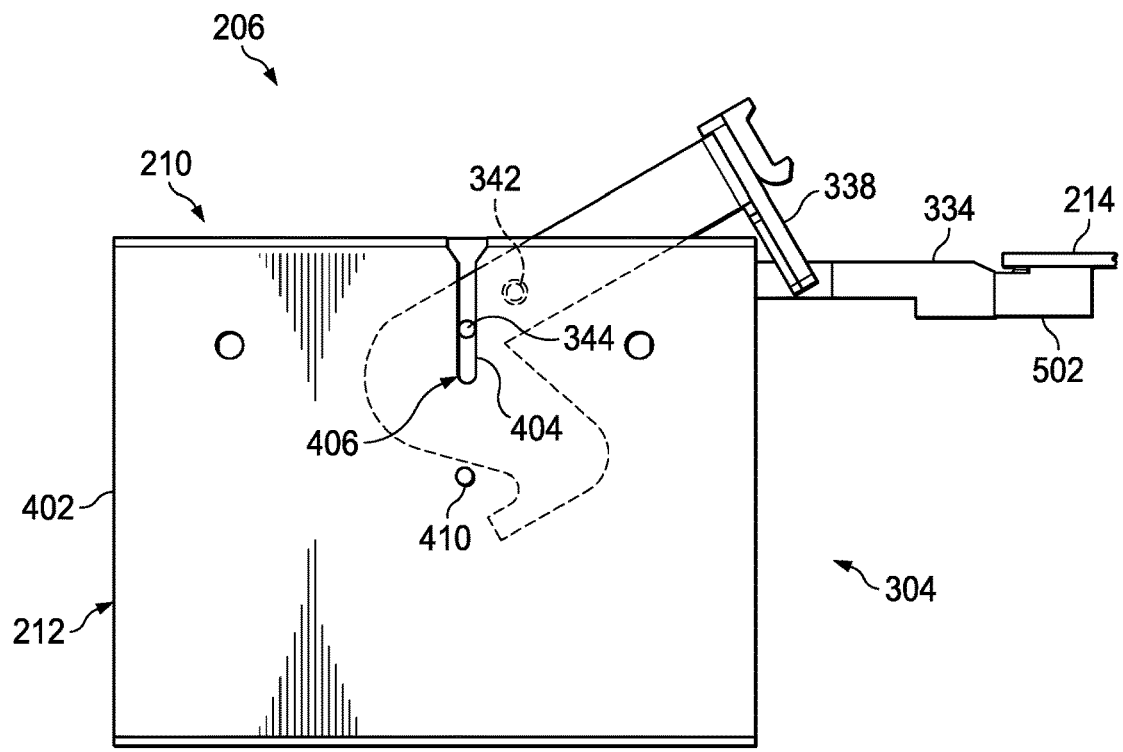
FIGS. 6A, 6B illustrate the fan carrier system, with a handle assembly of the fan carrier being rotated between first and second positions.
Figure 6A:
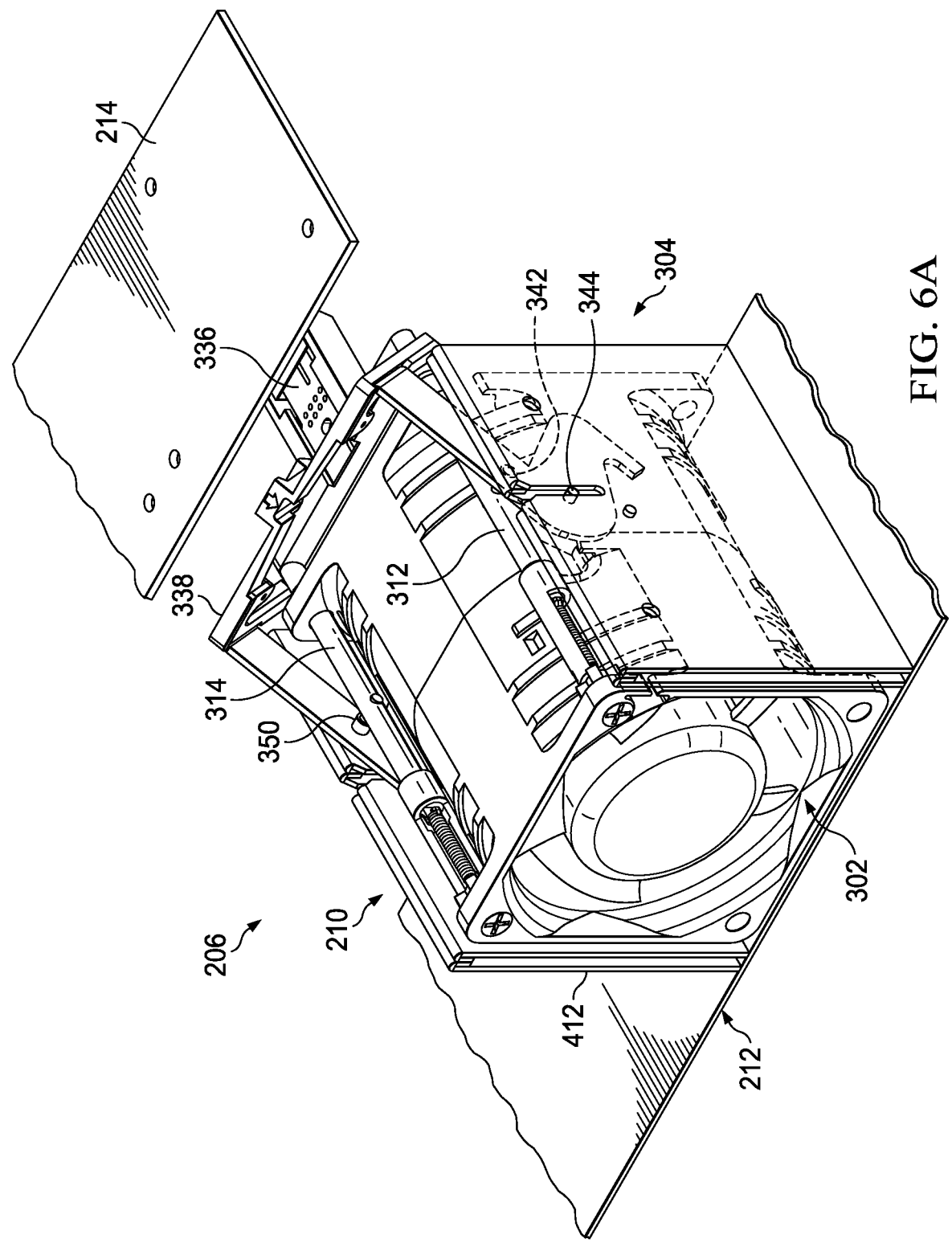

FIGS. 6A, 6B illustrate the fan carrier system 206, and in particular, when the handle assembly 338 is rotated from the first position. Specifically, the handle assembly 338 is rotatable about the first handle pin 342 and the second handle pin 350 to transfer the handle assembly 338 from the first position to a second position, described further herein. When the handle assembly 338 is rotated, the first carrier pin 344 and the second carrier pin (not shown) rise within the first slot 404 and the second slot (not shown), respectively. As a result, the first piston 312 and the second piston 314 translates towards the first end 304 of the fan apparatus 302. That is, rotation of the handle assembly 338 can be converted to translation of the first piston 312 and the second piston 314 via the first carrier pin 344, the second carrier pin (not shown), the first handle pin 342, and the second handle pin (not shown).

Figure 7A:
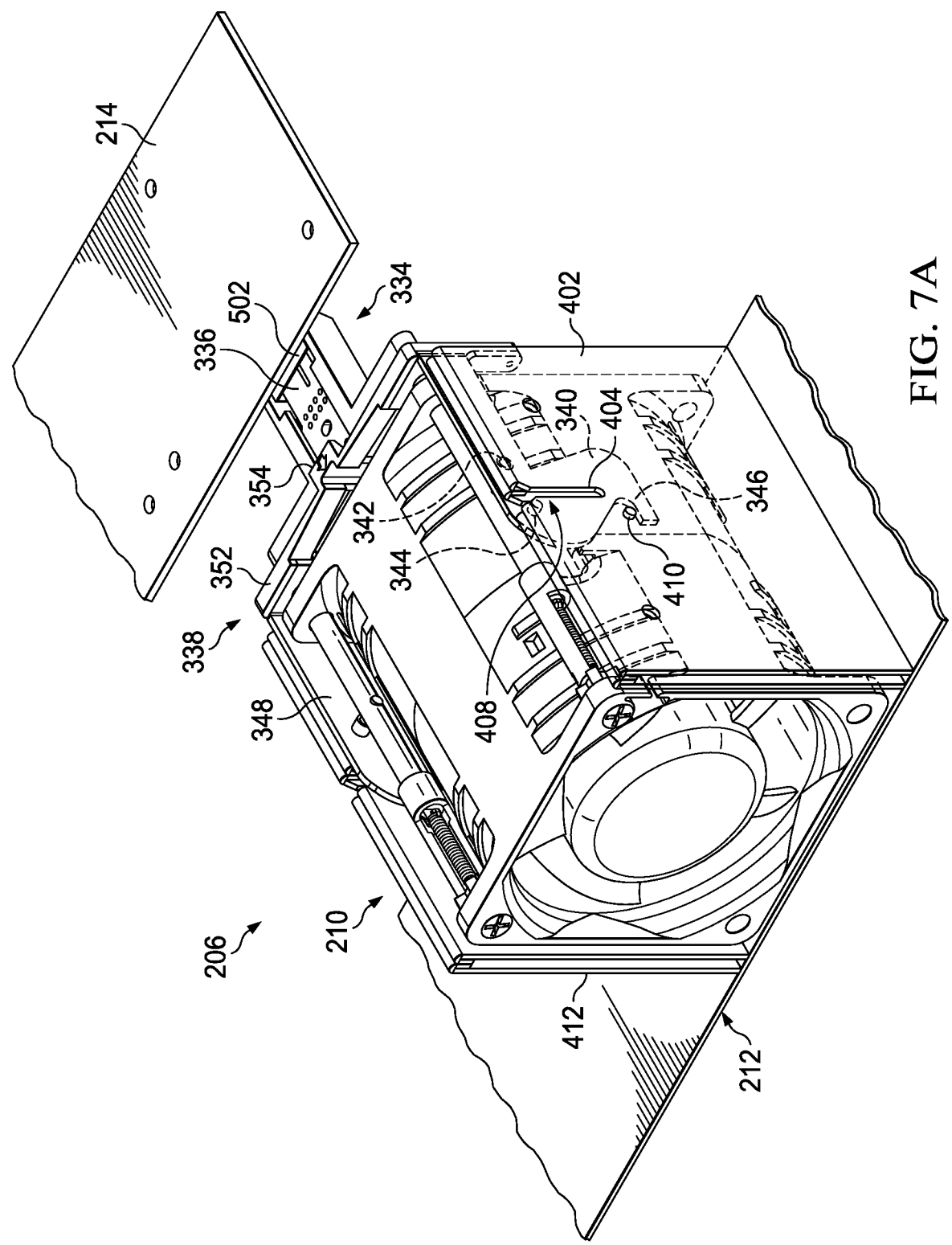
FIGS. 7A, 7B illustrate the fan carrier system, with the handle assembly rotated to the second position.
Figure 7B:
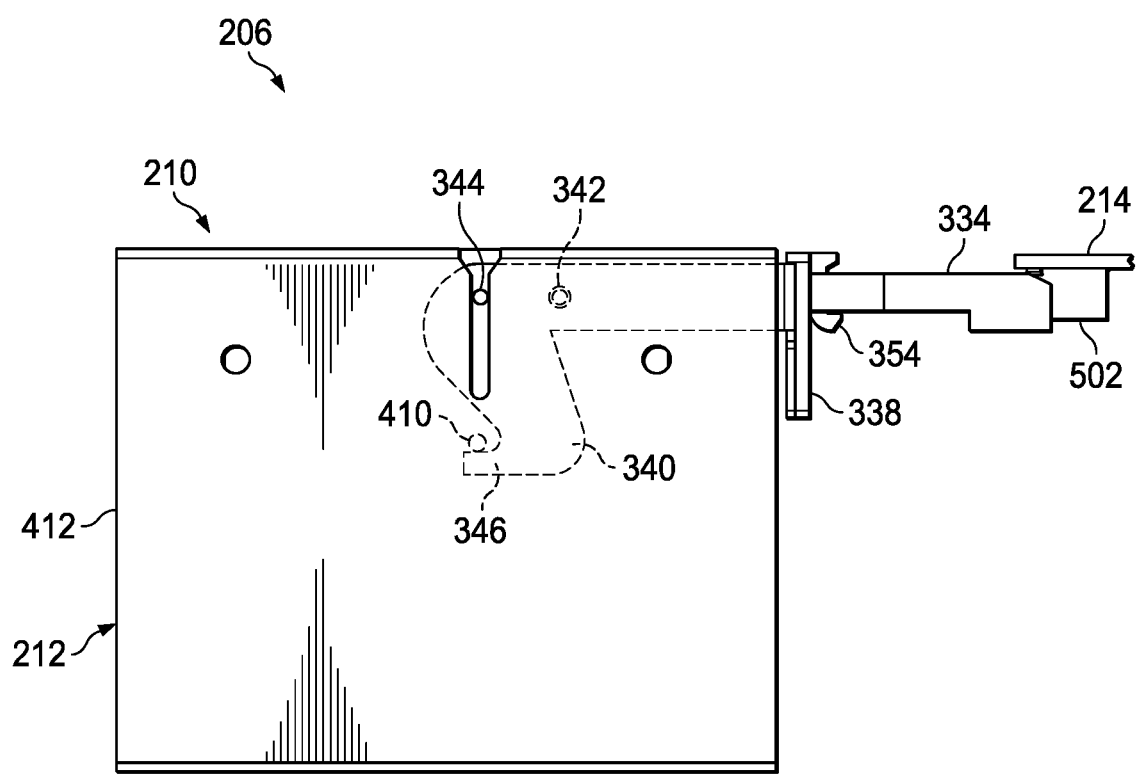

FIGS. 7A, 7B illustrate the fan carrier system 206, and in particular, when the handle assembly 338 is in the second position. When the handle assembly 338 is in the second position, the first carrier pin 344 is positioned at the second end 408 of the first slot 404 of the first wall 402; and the second carrier pin (not shown) is positioned at the second end (not shown) of the second slot (not shown) of the second wall 412. Furthermore, when the handle assembly 338 is in the second position, the first connector 336 of the connection assembly 334 is engaged with the second connector 502 of the PCB 214.

Moreover, when the handle assembly 338 is in the second position, the first hooking member 346 of the first arm 340 is engaged with the first chassis pin 410. Similarly, when the handle assembly 338 is in the second position, the second hooking member (not shown) of the second arm 348 is engaged with the second chassis pin (not shown).

Additionally, when the handle assembly 338 is in the second position, the locking member 354 is engaged with the connection assembly 334. That is, the locking member 354 is "locked" onto the connection assembly 334 to prevent the handle assembly 338 from rotating.

When the handle assembly 338 is rotating between the first and the second positions, a distance between the first carrier pin 344 and the first handle pin 342 is constant. Similarly, when the handle assembly 338 is rotating between the first and the second positions, a distance between the second carrier pin (not shown) and the second handle pin (not shown) is constant.

In some examples, when the handle assembly 338 is in the second position, the dampening gromets (not shown) are positioned between the handle 352 and the connection assembly 334. The dampening gromets can dampen vibrations (e.g., from the fan apparatus 302). By dampening the vibrations, the connection between the first connector 336 of the connection assembly 334 and the second connector 502 of the PCB 214 is maintained when the fan apparatus 302 is spinning/vibrating. Additionally, in some examples, the first connector 336 can be encapsulated with a dampening material to dampen such vibrations.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A fan carrier system, comprising:
    a fan carrier, including:
        a fan apparatus having i) a first end positioned opposite to a second end, and ii) a first side positioned opposite to a second side, the first and the second side extending between the first end and the second end;
        a first piston coupled to the fan apparatus, the first piston positioned along the first side, the first piston translatable between the first end and the second end;
        a connection assembly coupled to a first end of the first piston, the connection assembly including a first connector;
        a handle assembly, including:
            a first arm coupled to the first piston via a first handle pin, the first arm further including a first carrier pin;
            a handle coupled to the first arm;
    a chassis, including:
        a first wall including a first slot, the first slot including a first end positioned opposite a second end;
        a second wall including a second slot, the second slot including a first end positioned opposite a second end;
    wherein the fan carrier is insertable into the chassis between the first and the second walls such that when the handle assembly is in a first position, the first carrier pin is positioned at the first end of the first slot, and the first connector of the connection assembly is disengaged from a second connector of a printed circuit board (PCB), and when the handle assembly is in a second position, the first carrier pin is positioned at the second end of the first slot, and the first connector of the connection assembly is engaged with the second connector of the PCB,
    wherein the handle assembly is rotatable about the first handle pin to transfer the handle assembly between the first and the second positions.

2. The fan carrier system of claim 1, the fan carrier further including a second piston coupled to the fan apparatus, the second positioned along the second side, the second piston translatable between the first end and the second end; and the handle assembly further includes a second arm coupled to the second piston via a second handle pin, the second arm further including a second carrier pin, the handle additionally coupled to the second arm,
    wherein when the handle assembly is in the first position, the second carrier pin is positioned at the first end of the second slot, and
    wherein when the handle assembly is in the second position, the second carrier pin is positioned at the second end of the second slot.

3. The fan carrier system of claim 2, wherein the handle assembly is rotatable about the first and the second handle pins to transfer the handle assembly between the first and the second positions.

4. The fan carrier system of claim 3, wherein the handle is coupled between the first arm and the second arm.

5. The fan carrier system of claim 1, wherein the fan carrier further includes a first sleeve, the first piston at least partially positioned within the sleeve.

6. The fan carrier system of claim 1, wherein the fan carrier further includes an extension spring positioned between a second end of the first piston and the second end of the of the fan apparatus, the second end of the first piston opposite to the second end of the first piston.

7. The fan carrier system of claim 1, wherein the first wall further includes a first chassis pin and the first arm further includes a first hooking member, wherein when the handle assembly is in the second position, the first hooking member is engaged with the first chassis pin.

8. The fan carrier system of claim 1, wherein the handle further includes a locking member, wherein when the handle assembly is in the second position, the locking member is engaged with the connection assembly.

9. The fan carrier system of claim 1, wherein the handle further includes one or more dampening gromets, wherein when the handle assembly is in the second position, the dampening gromets are positioned between the handle and the connection assembly.

10. The fan carrier system of claim 1, wherein the fan apparatus includes an inlet fan and an exhaust fan.

11. The fan carrier system of claim 1, wherein a distance between the first carrier pin and the first handle pin is constant between the first position and the second position of the handle assembly.

12. A fan carrier, including:
a fan apparatus having i) a first end positioned opposite to a second end, and ii) a first side positioned opposite to a second side, the first and the second side extending between the first end and the second end;
a first piston coupled to the fan apparatus, the first piston positioned along the first side, the first piston translatable between the first end and the second end;
a connection assembly coupled to a first end of the first piston, the connection assembly including a first connector;
a handle assembly, including:
a first arm coupled to the first piston via a first handle pin, the first arm further including a first carrier pin;
a handle coupled to the first arm;
wherein the fan carrier is insertable into a chassis between first and the second walls of the chassis such that when the handle assembly is in a first position, the first carrier pin is positioned at a first end of a first slot of the first wall of the chassis, and the first connector of the connection assembly is disengaged from a second connector of a printed circuit board (PCB), and when the handle assembly is in a second position, the first carrier pin is positioned at a second end of the first slot, and the first connector of the connection assembly is engaged with the second connector of the PCB,
wherein the handle assembly is rotatable about the first handle pin to transfer the handle assembly between the first and the second positions.

13. The fan carrier of claim 12, further including a second piston coupled to the fan apparatus, the second positioned along the second side, the second piston translatable between the first end and the second end; and the handle assembly further includes a second arm coupled to the second piston via a second handle pin, the second arm further including a second carrier pin, the handle additionally coupled to the second arm,
wherein when the handle assembly is in the first position, the second carrier pin is positioned at the first end of the second slot, and
wherein when the handle assembly is in the second position, the second carrier pin is positioned at the second end of the second slot.

14. The fan carrier of claim 13, wherein the handle assembly is rotatable about the first and the second handle pins to transfer the handle assembly between the first and the second positions.

15. The fan carrier of claim 14, wherein the handle is coupled between the first arm and the second arm.

16. The fan carrier of claim 12, wherein the fan carrier further includes a first sleeve, the first piston at least partially positioned within the sleeve.

17. The fan carrier of claim 12, wherein the fan carrier further includes an extension spring positioned between a second end of the first piston and the second end of the of the fan apparatus, the second end of the first piston opposite to the second end of the first piston.

18. The fan carrier of claim 12, wherein the handle further includes a locking member, wherein when the handle assembly is in the second position, the locking member is engaged with the connection assembly.

19. The fan carrier of claim 12, wherein the handle further includes one or more dampening gromets, wherein when the handle assembly is in the second position, the dampening gromets are positioned between the handle and the connection assembly.

20. An information handling system, comprising:
a processor;
memory media storing instructions executable by the processor to perform operations;
a fan carrier, including:
a fan apparatus having i) a first end positioned opposite to a second end, and ii) a first side positioned opposite to a second side, the first and the second side extending between the first end and the second end;
a first piston coupled to the fan apparatus, the first piston positioned along the first side, the first piston translatable between the first end and the second end;
a connection assembly coupled to a first end of the first piston, the connection assembly including a first connector;
a handle assembly, including:
a first arm coupled to the first piston via a first handle pin, the first arm further including a first carrier pin;
a handle coupled to the first arm;
a chassis, including:
a first wall including a first slot, the first slot including a first end positioned opposite a second end;
a second wall including a second slot, the second slot including a first end positioned opposite a second end;
wherein the fan carrier is insertable into the chassis between the first and the second walls such that when the handle assembly is in a first position, the first carrier pin is positioned at the first end of the first slot, and the first connector of the connection assembly is disengaged from a second connector of a printed circuit board (PCB), and when the handle assembly is in a second position, the first carrier pin is positioned at the second end of the first slot, and the first connector of the connection assembly is engaged with the second connector of the PCB, wherein the handle assembly is rotatable about the first handle pin to transfer the handle assembly between the first and the second positions.

\* \* \* \* \*